(12) United States Patent
Wang

(10) Patent No.: US 7,849,594 B2
(45) Date of Patent: Dec. 14, 2010

(54) MANUFACTURING METHOD FOR INTEGRATING PASSIVE COMPONENT WITHIN SUBSTRATE

(75) Inventor: Chien-Hao Wang, Hukou Township, Hsinchu County (TW)

(73) Assignee: Advanced Semiconductor Engineering Inc., Kaohsiung (TW)

(*) Notice: Subject to any disclaimer, the term of this patent is extended or adjusted under 35 U.S.C. 154(b) by 175 days.

(21) Appl. No.: 12/007,339

(22) Filed: Jan. 9, 2008

(65) Prior Publication Data
US 2008/0163485 A1    Jul. 10, 2008

(30) Foreign Application Priority Data
Jan. 10, 2007    (TW) ............... 96100979 A

(51) Int. Cl.
*H05K 3/02*    (2006.01)
(52) U.S. Cl. .................. 29/847; 29/825; 29/829; 29/830; 29/832; 29/839; 29/840; 29/846; 29/852; 29/855; 29/867; 361/761
(58) Field of Classification Search ............ 29/847, 29/829, 830, 832, 837, 839, 840, 841, 846, 29/852, 855, 867, 825; 174/260, 254; 361/761
See application file for complete search history.

(56) References Cited

U.S. PATENT DOCUMENTS

| | | | | |
|---|---|---|---|---|
| 3,982,979 A * | 9/1976 | Hentz et al. | ................ | 156/73.6 |
| 6,546,620 B1 * | 4/2003 | Juskey et al. | .................. | 29/840 |
| 7,345,365 B2 * | 3/2008 | Lee et al. | .................... | 257/724 |
| 2002/0092163 A1 * | 7/2002 | Fraivillig | .................... | 29/847 |
| 2004/0119097 A1 * | 6/2004 | Lee et al. | .................... | 257/200 |
| 2005/0217893 A1 * | 10/2005 | Noguchi et al. | ............ | 174/250 |
| 2006/0024944 A1 * | 2/2006 | Jung | ......................... | 438/612 |
| 2006/0219428 A1 * | 10/2006 | Chinda et al. | ............... | 174/257 |
| 2009/0129037 A1 * | 5/2009 | Yoshino | ..................... | 361/761 |

FOREIGN PATENT DOCUMENTS

| | | | |
|---|---|---|---|
| JP | 2005039094 A | * | 2/2005 |
| TW | 511415 | | 1/2001 |
| TW | 2005539464 | | 12/2005 |
| TW | 1249231 | | 2/2006 |
| TW | 200623355 | | 7/2006 |
| TW | 1263313 | | 10/2006 |
| TW | 1269365 | | 12/2006 |
| TW | 1290812 | | 12/2007 |

* cited by examiner

*Primary Examiner*—Derris H Banks
*Assistant Examiner*—Azm Parvez
(74) *Attorney, Agent, or Firm*—Muncy, Geissler, Olds & Lowe, PLLC

(57) ABSTRACT

A manufacturing method for integrating a passive component within a substrate is disclosed. The manufacturing method comprises the steps of: providing a circuit layer, wherein a positioning blind hole is formed in the circuit layer; forming a conductive material in the positioning blind hole; positioning the passive component in the positioning blind hole of the circuit layer and electrically connecting the passive component to the circuit layer via the conductive material in the positioning blind hole; and laminating a core layer, the passive component, and the circuit layer as the substrate.

19 Claims, 8 Drawing Sheets

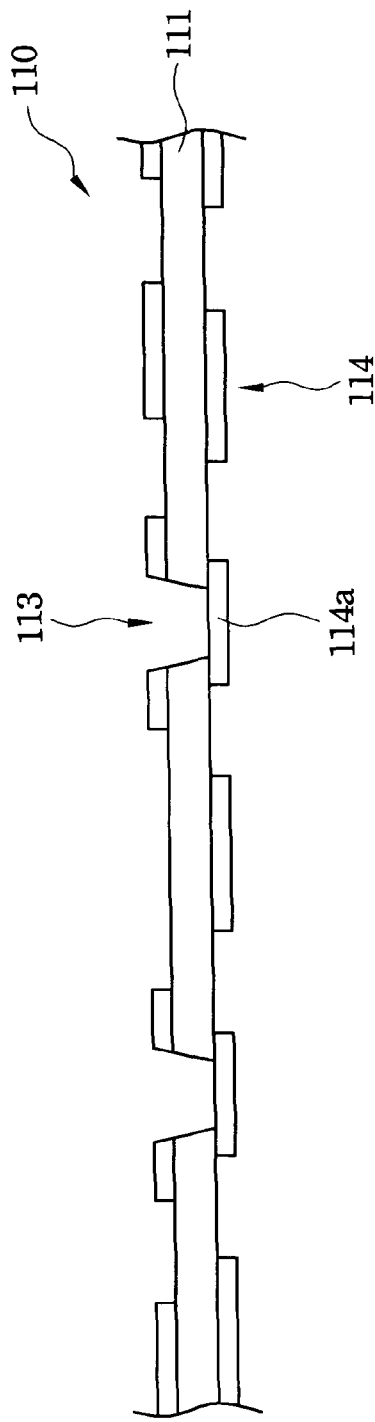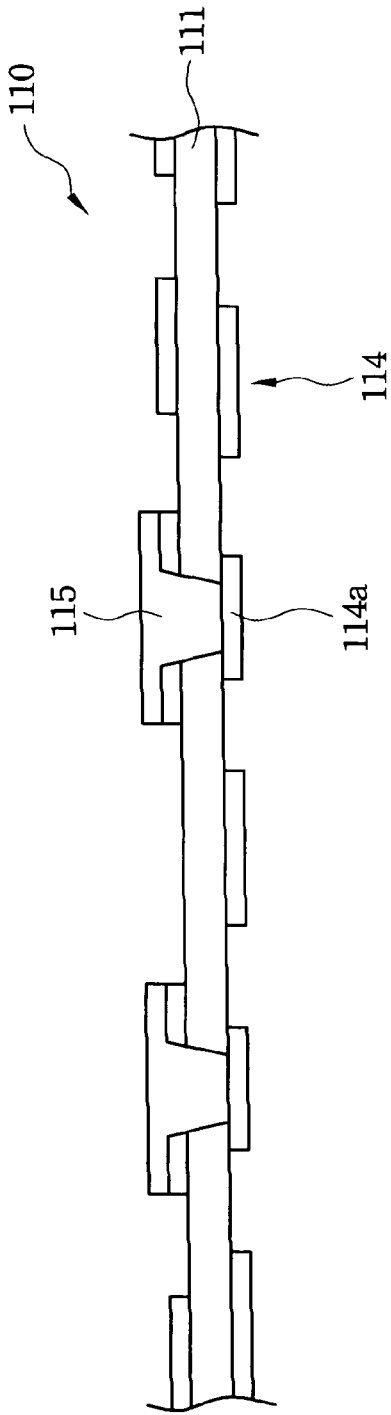
Fig. 1C
Fig. 1D

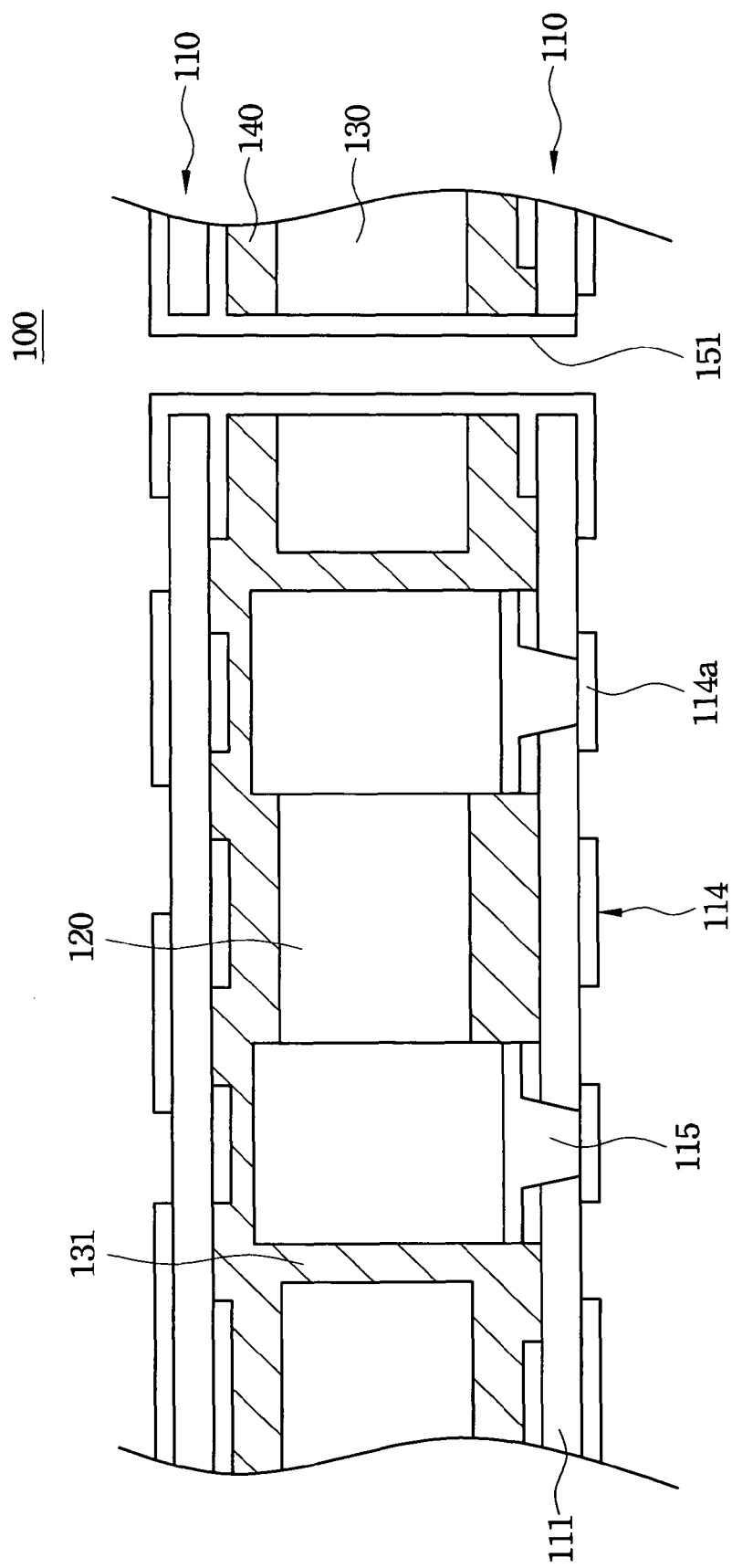

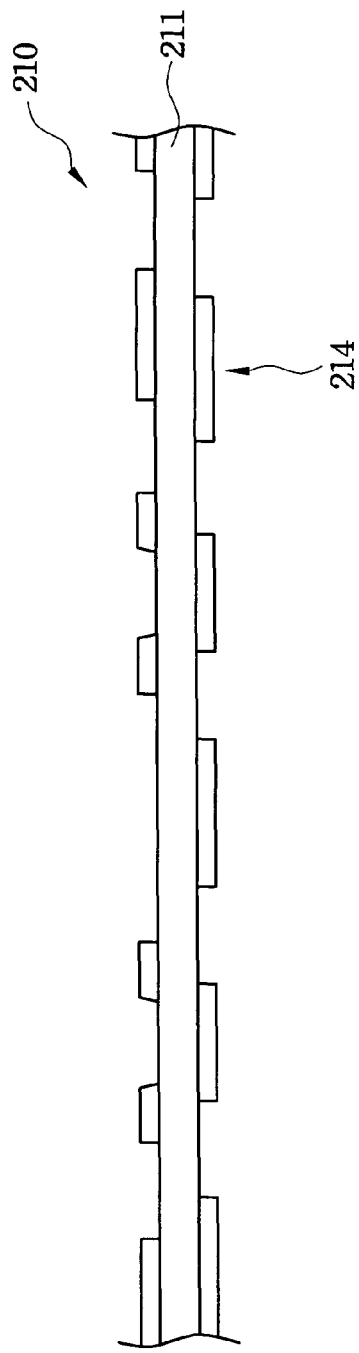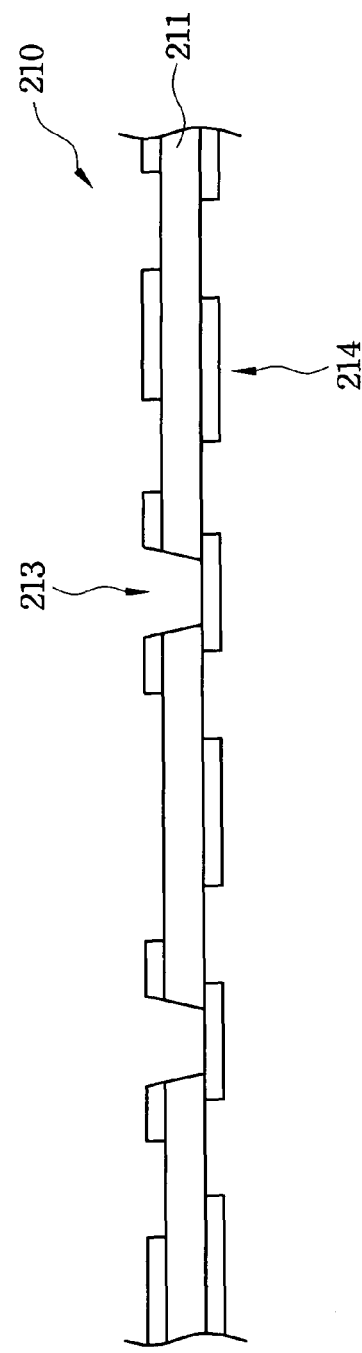

US 7,849,594 B2

MANUFACTURING METHOD FOR INTEGRATING PASSIVE COMPONENT WITHIN SUBSTRATE

RELATED APPLICATIONS

This application claims priority to Taiwan Application Serial Number 96100979, filed Jan. 10, 2007, which is herein incorporated by reference.

FIELD OF THE INVENTION

This invention relates to a manufacturing method for integrating at least one passive component within a substrate, and more particularly, to a method for positioning the passive component in the substrate in advance.

BACKGROUND OF THE INVENTION

For electronic devices today, the need of functionality and small size has gradually increased, and thus designers and suppliers thereof have to integrate more electronic devices into a package system. As to chip package, multi-chip module (MCM) or system-in-package (SIP) may provide the resolution of the foregoing problem. If MCM or SIP cooperated with embedding technique is used for integrating the Surface Mount Technology (SMT) passive components into a package substrate, more space on the surface of the substrate can be enhanced. Further, for the integrity of signal, in high frequency circuit design, the parasitic effect of electronic devices is a great issue. Compared with SMT passive components, an ideal embedded passive component has shorter connection therein, and thus has less parasitic effects. Therefore, the embedded passive component is suitable for the high frequency circuit design, and is important for the passive component design in the further.

Currently, when integrating the passive component into a substrate, the passive component is laminated within the substrate, and then the substrate is drilled for electrical connection. However, the position of drilling is predetermined, and if the position of the passive component is not accurate and precise, the position of drilling can not position to the electrical contact of the passive component. Therefore, the electrical connection of the passive component can not be achieved, thus affecting the product's yield significantly.

SUMMARY OF THE INVENTION

Therefore, an aspect of the present invention is to provide a manufacturing method for integrating at least one passive component within a substrate to prevent positioning error of the passive component therein, thereby enhancing the process yield thereof.

Another aspect of aspect of the present invention is to provide a manufacturing method for integrating at least one passive component within a substrate, whereby the passive component is positioned and electrically connected to a circuit layer on the substrate via an adhesive conductive material.

According to an embodiment of the present invention, the manufacturing method for integrating at least one passive component within a substrate comprises: providing at least one circuit layer, wherein at least one positioning blind hole is formed in the circuit layer; forming a conductive material in the positioning blind hole; positioning the passive component to the positioning blind hole of the circuit layer and electrically connecting the passive component to the circuit layer via the conductive material in the positioning blind hole; and laminating a core layer, the passive component and the circuit layer as the substrate, wherein the passive component is embedded in the core layer According to another embodiment of the present invention, the foregoing conductive material is adhesive.

Therefore, with the application of the method disclosed in the embodiments of the present invention, the passive component can be positioned on the circuit layer and electrically connected thereto via a conductive material in the positioning blind hole before a laminating step, wherein the conductive material may be adhesive to position the passive component in advance, thereby preventing positioning error and the passive component can not electrically connect with the circuit.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 1A through FIG. 1H are schematic flow diagrams showing the process for integrating at least one passive component within a substrate according to a first embodiment of the present invention;

FIG. 2A and FIG. 2B are schematic flow diagrams showing the process for integrating at least one passive component within a substrate according to a second embodiment of the present invention.

DETAILED DESCRIPTION OF THE PREFERRED EMBODIMENT

Figure 1A:
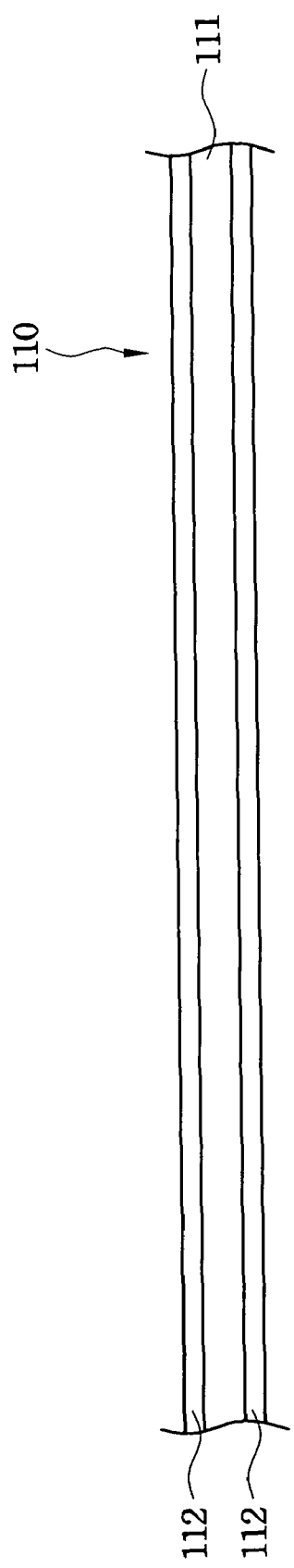
Figure 1B:
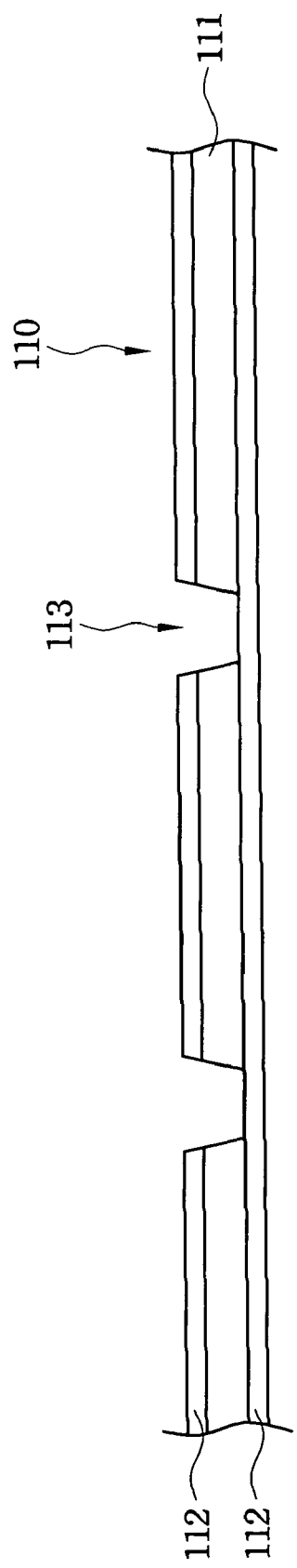
Figure 1E:
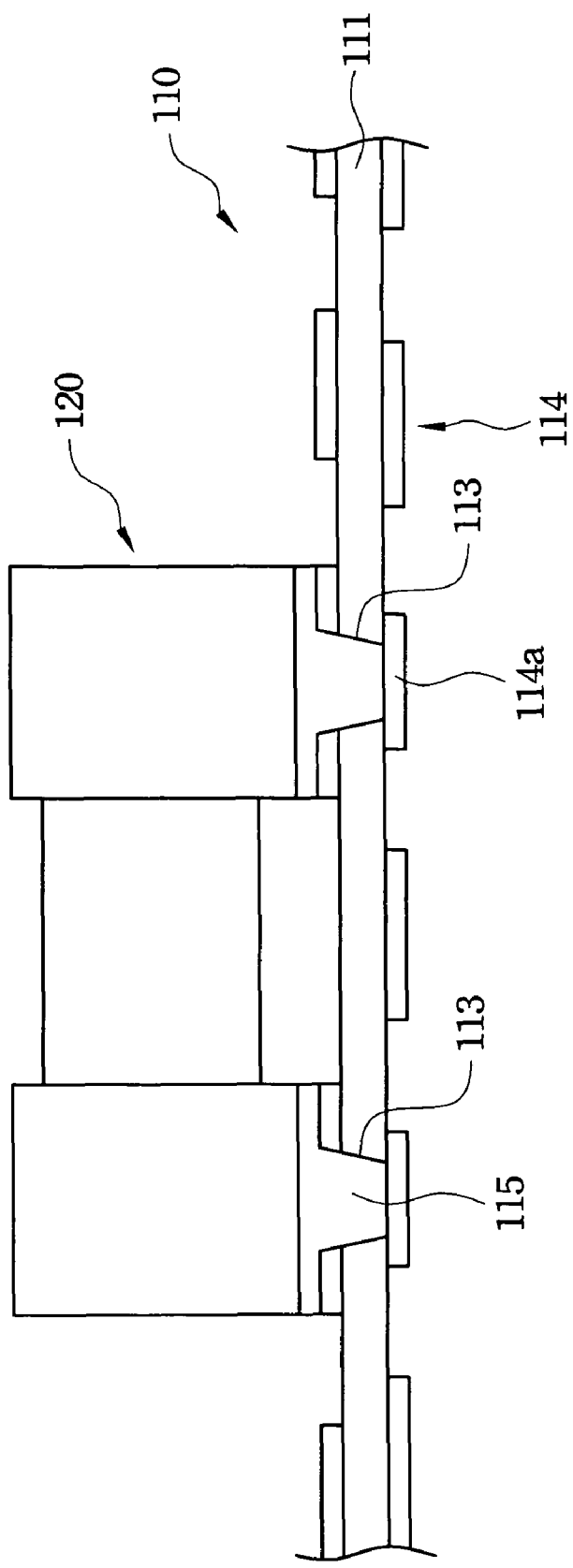
Figure 1F:
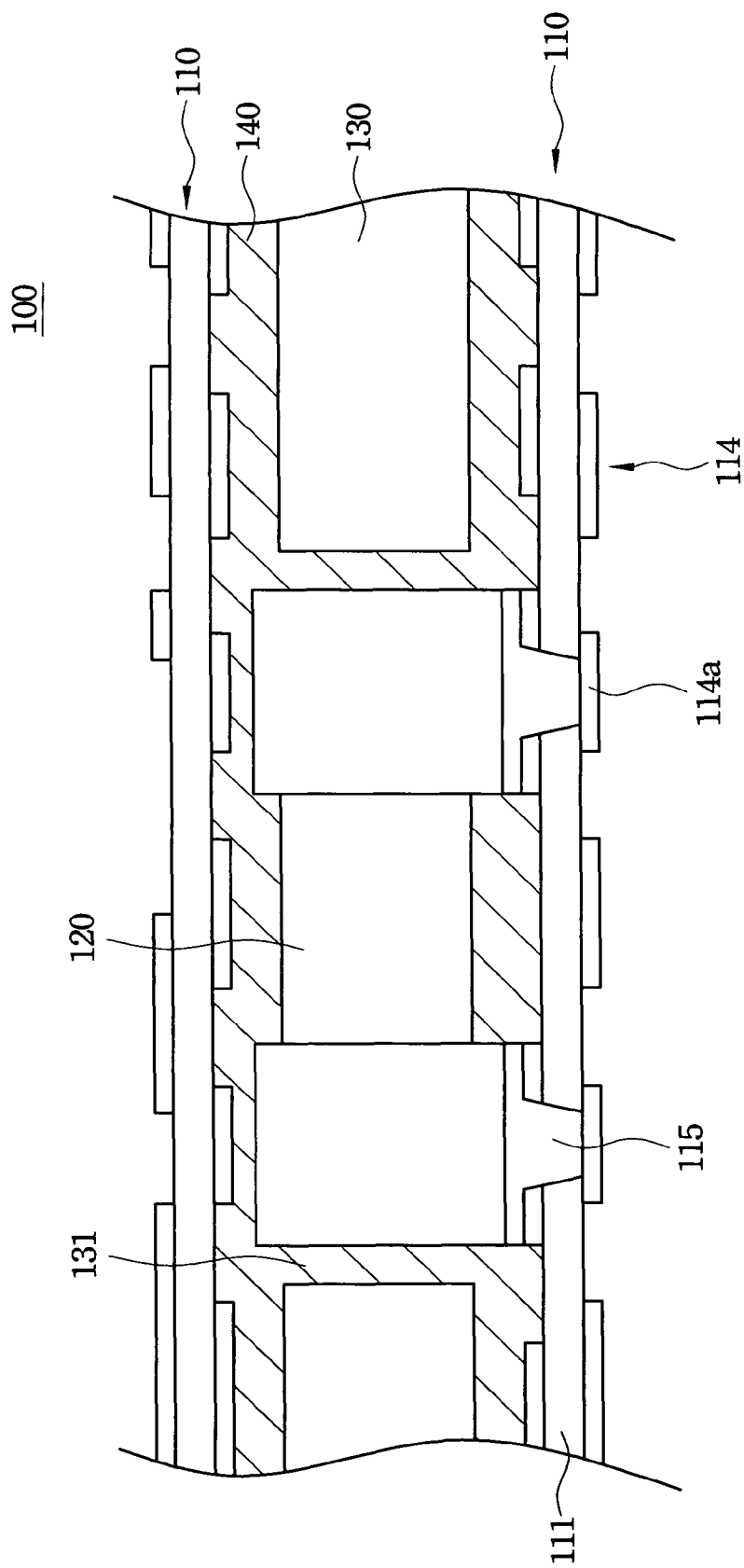
Figure 1H:
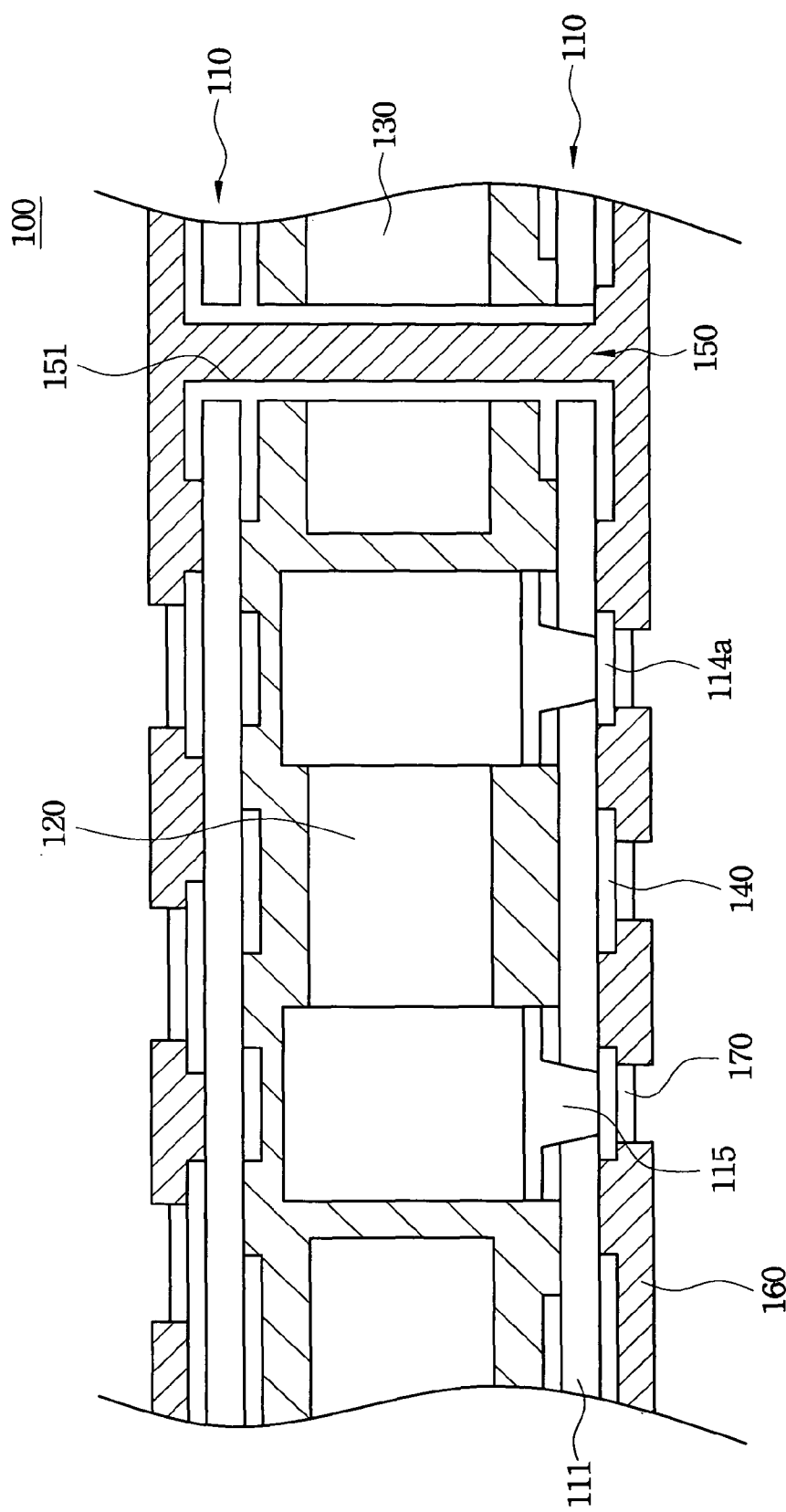

In order to make the illustration of the present invention more explicit and complete, the following description is stated with reference to FIG. 1A through FIG. 3.

Refer to FIG. 1A through FIG. 1H. FIG. 1A through FIG. 1H are schematic flow diagrams showing the process for integrating at least one passive component within a substrate according to a first embodiment of the present invention. Refer to FIG. 1A again. First, a circuit layer 110 is provided. The circuit layer 110 includes an intermediate layer 111 and an electrically conductive layer 112. The intermediate layer 111 is made of dielectric material. The electrically conductive layer 112 is formed at both sides of the intermediate layer 111 and made of metal material, such as Cu, Ni or Au.

Refer to FIG. 1B again. Next, at least one positioning blind hole 113 is formed in the circuit layer 110. The positioning blind hole 113 may be formed by a method such as laser drilling or mechanical drilling. The positioning blind hole 113 is drilled from one side of the circuit layer 110 of the electrically conductive layer 112, and another side of the electrically conductive layer 112 is not drilled, thereby forming the blind hole.

Refer to FIG. 1C again. Next, the electrically conductive layer 112 of the circuit layer 110 is patterned to form a circuit 114. The electrically conductive layer 112 is patterned by a method such as photolithography etching or laser etching. The circuit 114 includes at least one contact 114a connected to the positioning blind hole 113, thereby forming an electrical connection to at least one passive component 120.

Refer to FIG. 1D again. Next, a conductive material 115 is formed in (such as filled in) the positioning blind hole 113.

The conductive material 115 is preferably adhesive, such as a conductive glue or a melted metal.

Refer to FIG. 1E again. Next, the passive component 120 is disposed and positioned to the positioning blind hole 113 of the circuit layer 110. Since the positioning blind hole 113 has the conductive material 115 therein, and the contact 114a of the circuit 114 is connected to the positioning blind hole 113, the passive component 120 can be electrically connected to the circuit layer 110 via the conductive material 115 in the positioning blind hole 113. Further, since the conductive material 115 is preferably adhesive, the passive component 120 can be bonded and positioned to the circuit layer 110. For example, when the conductive material 115 is the conductive glue, the conductive material 115 is filled into the positioning blind hole 113 to bond and position the passive component 120 to the circuit layer 110. When the conductive material 115 is metal material, the conductive material 115 is heated previously to a melted state, and then filled into the positioning blind hole 113. The passive component 120 is bonded and positioned to the circuit layer 110 before the melted metal is solidified.

Refer to FIG. 1F again. Next, a core layer 130, the passive component 120 and two circuit layers 110 are laminated as one substrate 100, wherein a dielectric layer 140 is formed between the core layer 130 and the circuit layer 110. After the laminating step, the circuit layers 110 are formed on both sides of the core layer 130, and the passive component 120 is embedded in the core layer 130. The core layer 130 is made of dielectric material, such as Bismaleimide Triazine (BT), epoxy resin, ceramics or organic glass fiber. The core layer 130 includes at least one through hole 131 to embed the passive component 120. The through hole 131 may be formed by a method such as laser drilling or mechanical drilling. Therefore, the passive component 120 of the present embodiment can be positioned and bonded on the circuit layer 110 previously by the positioning blind hole 113, and be electrically connected to the circuit 114 on the circuit layer 110 via the conductive material 115 within the positioning blind hole 113, thereby preventing the passive component 120 from positioning error, wherein the conductive material 115 is preferably adhesive to previously bond the passive component 120 on the circuit layer 110.

It is worth mentioning that the circuit 114 on the circuit layer 110 may be formed after the laminating step. Namely, the electrically conductive layer 112 is patterned to form the circuit 114 of the circuit layer 110 after the laminating step.

Refer to FIG. 1G again. Next, after the laminating step, at least one conductive through hole 150 is formed in the substrate 100 by a method such as laser drilling or mechanical drilling. A metal layer 151 (such as Cu layer) is formed on the surface of the conductive through hole 150 to electrically connect with the circuit layers 110 on both sides of the core layer 130, wherein the metal layer 151 is formed by a method such as electroplating.

Refer to FIG. 1H again. Then, an isolation layer 160 (such as solder mask) is used to encapsulate the surface of the substrate 100 for packaging, wherein the circuit 114 is exposed on the circuit layers 110 after encapsulating the isolation layer 160. Further, a conductive antioxidant 170 may be formed on the circuit 114 to prevent oxidation. Therefore, the passive component 120 can be integrated into the substrate 100 of the present embodiment.

Therefore, the passive component 120 of the present embodiment can be positioned on the circuit layer 110 before the laminating step, thereby preventing positioning error and the passive component 120 can not electrically connect with the circuit 114. Consequently, the process yield of the substrate 100 integrated with the passive component 120 can be enhanced.

Refer to FIG. 2A and FIG. 2B. FIG. 2A and FIG. 2B are schematic flow diagrams showing the process for integrating at least one passive component within a substrate according to a second embodiment of the present invention. Some reference numerals shown in the first embodiment are used in the second embodiment of the present invention. The construction shown in the second embodiment is similar to that in the first embodiment with respect to configuration and function, and thus is not stated in detail herein.

Refer again to FIG. 2A and FIG. 2B, in comparison with the first embodiment, the circuit 214 is formed on the circuit layer 210, and then the positioning blind hole 213 is formed in the circuit layer 210. At this time, the circuit 214 may be formed by a method such as deposition (electroplating, thermal deposition, chemical vapor deposition, physical vapor deposition or sputtering) or printing (screen printing) on the two sides of the middle layer 211, and the electrically conductive layer 112 is not necessary to exist. Then, after forming the circuit 214, the circuit layer 210 is drilled to form the positioning blind hole 213.

Figure 3:
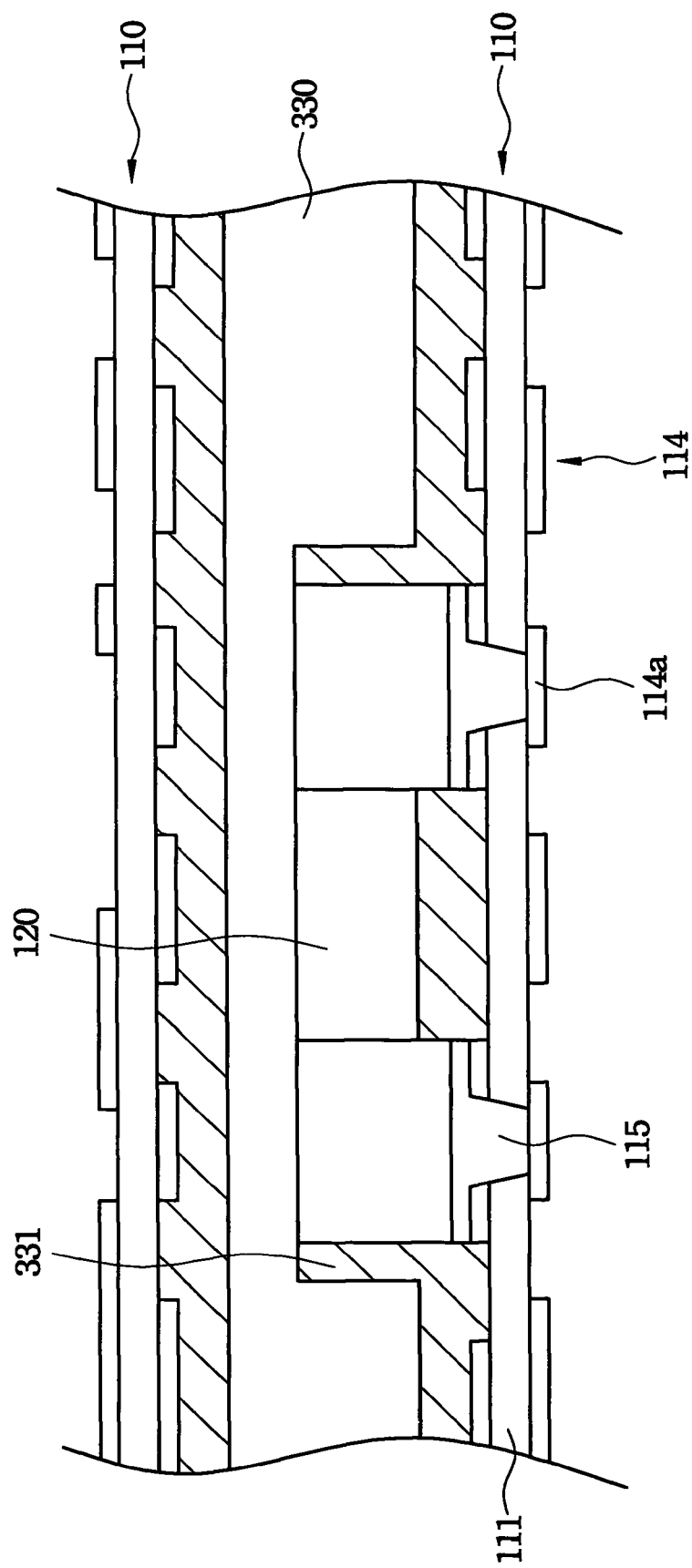
FIG. 3 is a cross-section view showing a substrate integrated with at least one passive component according to a third embodiment of the present invention.

Refer to FIG. 3. FIG. 3 is a cross-section view showing a substrate integrated with at least one passive component according to a third embodiment of the present invention. Some reference numerals shown in the first embodiment are used in the third embodiment of the present invention. The construction shown in the third embodiment is similar to that in the first embodiment with respect to configuration and function, and thus is not stated in detail herein.

Refer again to FIG. 3, in comparison with the first embodiment, the core layer 330 includes at least one blind hole 331 to embed the passive component 120. The blind hole 331 may be formed by a method of such as laser drilling or mechanical drilling. At this time, the passive component 120 is positioned to the circuit layer 110 at one side of the core layer 330.

Therefore, the manufacturing method for integrating the passive component within the substrate shown in the respective embodiments of the present invention can prevent positioning error of the passive component, thereby ensuring that the passive component electrically connects with the circuit of the substrate and enhancing the process yield thereof.

As is understood by a person skilled in the art, the foregoing embodiments of the present invention are strengths of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A manufacturing method for integrating at least one passive component within a substrate, comprising:

providing at least one circuit layer, wherein at least one positioning blind hole is formed in the circuit layer;

forming a conductive material in the positioning blind hole;

after the conductive material in the positioning blind hole is formed, positioning the passive component to the positioning blind hole of the circuit layer and electrically connecting the passive component to the circuit layer via the conductive material in the positioning blind hole; and laminating a core layer, the passive component and the circuit layer as the substrate, wherein the passive component is embedded in the core layer;

forming a dielectric layer between the core layer and the circuit layer.

2. The method as claimed in claim 1, wherein the conductive material is adhesive.

3. The method as claimed in claim 2, wherein the conductive material is a conductive glue.

4. The method as claimed in claim 2, wherein the conductive material is a melted metal.

5. The method as claimed in claim 1, wherein the positioning blind hole is formed by a method of laser drilling or mechanical drilling.

6. The method as claimed in claim 1, further comprising:
forming a circuit on the circuit layer.

7. The method as claimed in claim 6, further comprises:
encapsulating an isolation layer on the surface of the substrate, and exposing the circuit.

8. The method as claimed in claim 7, wherein the isolation layer is a solder mask.

9. The method as claimed in claim 6, further comprises:
forming a conductive antioxidant on the circuit.

10. The method as claimed in claim 6, wherein the step of forming the circuit comprises:
patterning an electrically conductive layer on the circuit layer to form the circuit.

11. The method as claimed in claim 10, wherein the electrically conductive layer is made of Cu, Ni Au.

12. The method as claimed in claim 10, wherein the step of pattering is an etching step.

13. The method as claimed in claim 6, wherein the step of forming the circuit is a deposition step.

14. The method as claimed in claim 1, further comprises:
after the laminating the substrate, forming at least one conductive through hole in the substrate.

15. The method as claimed in claim 14, further comprises:
forming a metal layer on the surface of the conductive through hole.

16. The method as claimed in claim 15, wherein the metal layer is formed by a method of electroplating.

17. The method as claimed in claim 1, further comprises:
forming at least one through hole in the core layer to embed the passive component.

18. The method as claimed in claim 1, further comprises:
forming at least one blind hole in the core layer to embed the passive component.

19. A manufacturing method for integrating at least one passive component within a substrate, comprising:
providing at least one circuit layer, wherein at least one positioning blind hole is formed in the circuit layer;
forming a conductive material in the positioning blind hole, wherein the conductive material is adhesive;
after the conductive material in the positioning blind hole is formed, positioning the passive component to the positioning blind hole of the circuit layer and electrically connecting the passive component to the circuit layer via the conductive material in the positioning blind hole; and
laminating a core layer, at least one dielectric layer, the passive component and the circuit layer as the substrate, wherein the passive component is embedded in the core layer;
forming a dielectric layer between the core layer and the circuit layer.

* * * * *